(12) United States Patent
Storer et al.

(10) Patent No.: US 7,079,051 B2
(45) Date of Patent: Jul. 18, 2006

(54) IN-PLACE DIFFERENTIAL COMPRESSION

(76) Inventors: James Andrew Storer, 89 S. Great Rd., Lincoln, MA (US) 01773; Dana Shapira, 80 Pleasant St., Apt. 53, Brookline, MA (US) 02446

(*) Notice: Subject to any disclaimer, the term of this patent is extended or adjusted under 35 U.S.C. 154(b) by 0 days.

(21) Appl. No.: 10/803,507

(22) Filed: Mar. 18, 2004

(65) Prior Publication Data

US 2005/0219075 A1 Oct. 6, 2005

(51) Int. Cl.
*H03M 7/38* (2006.01)
(52) U.S. Cl. .......................... 341/51; 341/50
(58) Field of Classification Search ................ 341/50, 341/51
See application file for complete search history.

(56) References Cited

U.S. PATENT DOCUMENTS

| | | | |
|---|---|---|---|
| 4,366,551 A | 12/1982 | Holtz | |
| 4,558,302 A | 12/1985 | Welch | |
| 4,646,061 A | 2/1987 | Bledsoe | |
| 4,701,745 A | 10/1987 | Waterworth | |
| 4,730,348 A | 3/1988 | MacCrisken | |
| 4,814,746 A | 3/1989 | Miller et al. | |
| 4,876,541 A | 10/1989 | Storer | |
| 4,905,297 A | 2/1990 | Langdon et al. | |
| 4,906,991 A | 3/1990 | Fiala et al. | |
| 5,003,307 A | 3/1991 | George et al. | |
| 5,016,009 A | 5/1991 | Whiting et al. | |
| 5,126,739 A | 6/1992 | George et al. | |
| 5,153,591 A | 10/1992 | Clark | |
| 5,175,543 A | 12/1992 | Lantz | |
| 5,179,378 A * | 1/1993 | Ranganathan et al. | 341/51 |
| 5,253,325 A | 10/1993 | Clark | |
| 5,379,036 A * | 1/1995 | Storer | 341/51 |
| 5,406,279 A * | 4/1995 | Anderson et al. | 341/51 |
| 5,479,654 A | 12/1995 | Squibb | |
| 5,608,396 A | 3/1997 | Cheng et al. | |
| 5,745,906 A | 4/1998 | Squibb | |
| 5,813,017 A | 9/1998 | Morris | |
| 6,018,747 A | 1/2000 | Burns et al. | |
| 6,233,589 B1 | 5/2001 | Muralidhar | |
| 6,374,250 B1 | 4/2002 | Ajtai et al. | |
| 6,671,703 B1 | 12/2003 | Thompson et al. | |

OTHER PUBLICATIONS

Ajtai, Burns, Fagin, and Long. "Compactly Encoding Unstructured Inputs with Differential Compression", J. of the ACM 49:3, 318-367. (U.S.), vol. 49, No. 3, May 2002.

Apostolico, Browne, and Guerra [1992]. "Fast Linear-Space Computations of Longest Common Subsequences", Theoretical Computer Science, 92:1, 3-17 (U.S.), vol. 92, No. 1, Jan. 6, 1992.

(Continued)

*Primary Examiner*—Jean Bruner Jeanglaude

(57) ABSTRACT

To enhance the distribution or backup of data similar to previously distributed or backed up data, to provide similarity testing, and other benefits, a first body of data T of size n is compressed with respect to a second body of data S of size m in-place; that is, the memory containing S is overwritten from left to right so that at no time is more than a total of MAX{m,n}+O(1) memory used.

23 Claims, 3 Drawing Sheets

IPSW method.

OTHER PUBLICATIONS

Burns and Long [1997]. "A Linear Time, Constant Space Differencing Algorithm", Proc. IEEE Int. Conf. on Perform., Comp., and Communications. (U.S.), Feb. 1997.

Burns and Long [1997b]. "Efficient Distributed Backup and Restore with Delta Compression", Workshop on I/O in Parallel and Distributed Systems (IOPADS). (U.S.), no month.

Burns, Stockmeyer, and D. D. E. Long [2002]. "Experimentally Evaluating In-Place Delta Reconstruction", NASA Conf. on Mass Storage Sys. and Tech.,(U.S.), no month.

Cormode, Paterson, Sahinalp and Vishkin [2000]. "Communication Complexity of Document Exchange", Proc. 11th Symp. on Discrete Algorithms, 197-206. (U.S.), no month.

Factor, Sheinwald, and Yassour [2001]. "Software Compression in the Client/Server Environment", Proc. Data Compression Conf., IEEE Comp. Society Press, 233-242. (U.S.), Mar. 27-29, 2001.

Fraser and Myers [1987]. "An Editor for Revision Control", ACM Transactions on Programming Languages and Systems 9:2, 277-295. (U.S.), vol. 9 No. 2, Apr. 1997.

Hunt, Vo, and Tichy [1998]. "Delta algorithms: An Empirical Analysis", ACM Trans. on Software Engineering and Methodology 7, 192-214. (U.S), vol. 2, No. 2, Apr. 1998.

Huffman [1952]. "A Method for the Construction of Minimum-Redundancy Codes", Proceedings of the IRE 40, 1098-1101. (U.S.), Sep. 1952.

Lempel and Ziv [1976]. "On the Complexity of Finite Sequences", IEEE Transactions on Information Theory 22:1, 75-81. (U.S.), no month.

Miller and Myers [1985]. "A File Comparison Program", Software—Practice and Experience 15:11, 1025-1040. (U.S.), unknown month.

Rick [1995]. "A New Flexible Algorithm for the Longest Common Subsequence Problem", Proc. 6th Annual Symposium on Combinatorial Pattern Matching, Espoo, Finland, 5-7. (U.S.), unknown month.

Shapira, and Storer [2002]. "Edit Distance with Move Operations", Proceedings Conference of Combinatorial Pattern Matching (CPM) Springer, 85-98. (U.S.), unknown month.

Reichenberger [1991]. "Delta Storage for Arbitrary Non-Text Files", Proc. 3rd Int. Workshop on Software Configuration Management, Trondheim, Norway, 12-14 (U.S.), unknown month.

Shapira, and Storer [2003]. "In-Place Differential File Compression", Proc. 2003 Data Comp. Conf. (published Mar. 25, 2003), IEEE Comp. Soc. Press, 263-272. (U.S.).

Storer and T. G. Szymanski [1978]. "The Macro Model for Data Compression", Proc. 10th Annual ACM Symposium of the Theory of Computing, San Diego, CA, 30-39. (U.S.), unknown month.

Storer and Szymanski [1982]. "Data Compression Via Textual Substitution", Journal of the ACM 29:4, 928-951. (U.S.), unknown month.

Storer [1988]. Data Compression: Methods and Theory, Computer Science Press (a subsidiary of W. H. Freeman Press). (U.S.), unknown month.

Storer [2002]. "An Introduction to Data Structures and Algorithms", Birkhauser—Springer. (U.S.), unknown month.

Tichy [1984]. "The String to String Correction Problem with Block Moves", ACM Transactions on Computer Systems 2:4, 309-321. (U.S.), unknown month.

Wagner and Fischer [1973]. "The String-to-String Correction Problem", Journal of the ACM 21:1, 168-173. (U.S.), unknown month.

Weiner [1973]. "Linear Pattern Matching Algorithms", Proceedings of the 14th Annual IEEE Symposium on Switching and Automata Theory 1-11. (U.S.), unknown month.

Ziv and Lempel [1977]. "A Universal Algorithm for Sequential Data Compression", IEEE Transactions on Information Theory 23:3, 337-343. (U.S.), unknown month.

Ziv and Lempel [1978]. "Compression of Individual Sequences Via Variable-Rate Coding", IEEE Transactions on Information Theory 24:5, 530-536. (U.S.), unknown month.

Burns and Long [1998]. "In-place Reconstruction of Delta Compressed Files", Proc. ACM Conf. Principles of Distributed Comp. (PODC) (U.S.), no month.

* cited by examiner

*IPSW method.*

*sliding window compression*

*linking of gaps*

IN-PLACE DIFFERENTIAL COMPRESSION

BACKGROUND OF THE INVENTION

The present invention relates to in-place differential compression, where a body of data T is compressed with respect to a body of data S by performing copies from S in such a way that no additional memory is used beyond what is needed to store the longer of S or T; that is, when decoding, S is overwritten from left to right as T is constructed in its place.

There have been many patents and technical papers that pertain to data compression. Many relate to techniques different than ones that employ string copying such as Huffman coding (e.g., U.S. Pat. No. 4,646,061) or arithmetic coding (e.g., U.S. Pat. No. 4,905,297). Many relate to techniques that employ string copies but in a traditional data compression model where a single body of data is compressed, not in-place differential compression of a first body of data with respect to a second body of data; for example, U.S. patents such as Holtz [U.S. Pat. No. 4,366,551], Welch [U.S. Pat. No. 4,558,302], Waterworth [U.S. Pat. No. 4,701,745], MacCrisken [U.S. Pat. No. 4,730,348], Miller and Wegman [U.S. Pat. No. 4,814,746], Storer [U.S. Pat. Nos. 4,876,541, 5,379,036], Fiala and Greene [U.S. Pat. No. 4,906,991], George, Ivey, and Whiting [U.S. Pat. Nos. 5,003,307, 5,016,009, 5,126,739], Rubow and Wachel [U.S. Pat. No. 5,023,610], Clark [U.S. Pat. Nos. 5,153,591, 5,253,325], Lantz [U.S. Pat. No. 5,175,543], Ranganathan and Henriques [U.S. Pat. No. 5,179,378], Cheng, Craft, Garibay, and Karnin [U.S. Pat. No. 5,608,396], and technical articles such as Lempel and Ziv [1977, 1979] and Storer [1978, 1988, 1982, 2002].

There have also been a number of patents and technical papers relating to differential compression that do not perform decoding in-place; for example: Squibb [U.S. Pat. Nos. 5,479,654, 5,745,906], Morris [U.S. Pat. No. 5,813,017], Muralidhar and Chandan [U.S. Pat. No. 6,233,589], Thompson, Peterson, and Mohammadioun [U.S. Pat. No. 6,671,703], and technical articles such as Weiner [1973] (who developed a linear time and space greedy copy/insert algorithm using a suffix tree to search for matching substrings), Wagner and Fischer [1973] (who considered the string-to-string correction problem), Heckel [1978] (who presented a linear time algorithm for detecting block moves using longest common substring techniques), Tichy [1984] (who used edit-distance techniques for differencing and considered the string to string correction problem with block moves), Miller and Myers [1985] (who presented a comparison program for producing delta files), Fraser and Myers [1987] (who integrated version control into a line editor so that on every change a minimal delta is retained), Reichenberger [1991] (who presented a greedy algorithm for differencing), Apostolico, Browne, and Guerra [1992] and Rick [1995] (who considered methods for computing longest common subsequences), Burns and Long [1997b] (use delta compression to modify ADSM, Adstar Distributed Storage Manager of IBM, to transmit compact encodings of versioned data, where the client maintains a store of reference files), Hunt, Tichy and Vo [1998] (who combine Lempel-Ziv type compression and differential compression to compute a delta file by using a reference file as part of the dictionary to compress a target file), Factor, Sheinwald and Yassour [2001] (who present a Lempel Ziv based compression with an extended dictionary with shared data), Shapira and Storer [2002] (who give theoretical evidence that determining the optimal set of move operations is not computationally tractable, and present an approximation algorithm for a block edit-distance problem), Agarwal, Amalapurapu, and Jain [2003] (who speed up differential compression with hashing techniques and additional data structures such as suffix arrays).

There has also been commonly available software available for differencing that does not employ in-place decoding with string copying, such as the UNIX diff, xdelta and zdelta utilities.

Burns and Long [1997], M. Ajtai, R. Burns, R. Fagin, and D. D. E. Long [2002], and the U.S. patent of Ajtai, Burns, Fagin, and Stockmeyer [U.S. Pat. No. 6,374,250] use a hash table with Karp-Rabin footprints to perform differential compression of one file with respect to another, using constant space in addition to that used by both files, but do not provide for in-place decoding.

Burns and Long [1998], Burns, Stockmeyer, and Long [2002], and the U.S. Patent of Burns and Long [U.S. Pat. No. 6,018,747] present an in-place reconstruction of differential compressed data, but do not perform the reconstruction with copies that overwrite from left to right. They begin with a traditional delta file and work to detect and eliminate write-before-read conflicts (increasing the size of the delta coding).

The invention disclosed here is in part motivated by the research presented in Shapira and Storer [2003].

BRIEF SUMMARY OF THE INVENTION

Therefore, it is an object of this invention to perform in-place differential compression. With differential compression, a body of data T is compressed with respect to a body of data S. That is, an encoder and decoder have available identical copies of S, and the encoder may copy substrings from S to form T. A pointer that copies a string w from S achieves data compression when the bits representing that pointer are fewer than the bits representing w. We use the variable n to denote the size of T and m to denote the size of S. Differential compression is in-place if the memory containing S is overwritten when decoding T so that at no time is more than a total of MAX{m,n} memory used, in addition to the constant amount of memory to store the program itself along with its local variables.

It is another object of this invention to rearrange the substrings of S to better align S and T to enhance the effectiveness of copying substrings from S to T in-place.

An in-place differential compression method according to the present invention includes the steps of rearranging substrings of S to improve the alignment of substrings of T with substrings of S and decoding in-place by copying substrings of S to form portions of T in a way that overwrites S.

DETAILED DESCRIPTION OF THE INVENTION

Figure 1:
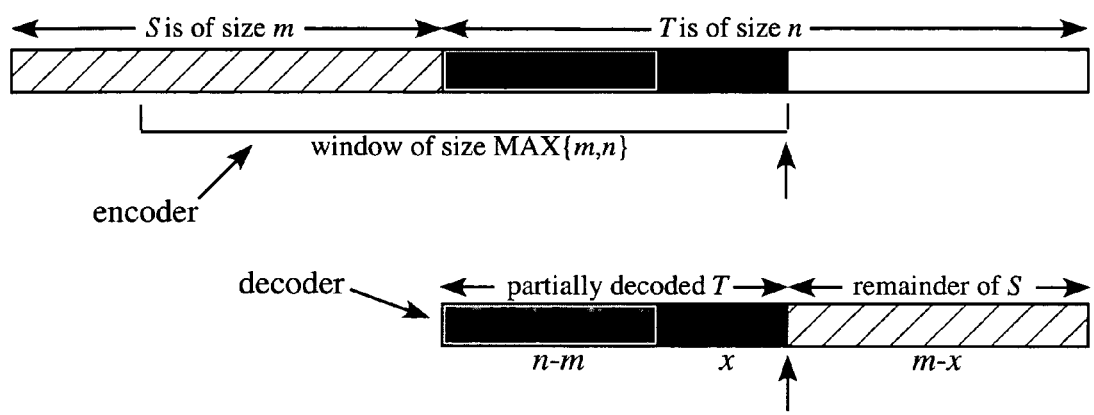
FIG. 1 shows encoding on the top and on the bottom the way in which in-place decoding overwrites memory.

With differential compression, a body of data S of size m is compressed with respect to a body of data T of size n. That is, both the encoder and the decoder have a copy of S and then a new string T may be encoded and subsequently decoded by making use of S (e.g. copying substrings of S).

There are many practical applications where new information is received or generated that is highly similar to information already present. When a software revision is released to licensed users, the distributor can require that a user must perform the upgrade on the licensed copy of the existing version. When incremental backups are performed for a computing system, differential compression can be used to compress a file with respect to its version in a previous backup, with respect to a similar file in a previous backup, or with respect to a file already processed in the current backup. Differential file compression can also be a powerful string similarity test in browsing and filtering applications.

One of ordinary skill in the art can understand that there are many ways that compressed data may be transmitted from an encoder to a decoder, including on a communications link, over a wireless connection, through a buffer, by transfer to and from a storage device, etc., and that the form of compressed data transmission from the encoder to decoder does not limit the invention herein disclosed.

Differential compression is in-place if the memory containing S is overwritten when decoding T so that at no time is more than a total of MAX$\{m,n\}$ memory used. Of course, the decoder has stored somewhere the executable code for the decoding program (possibly in read-only memory or hardware), which not is part of memory used when we refer to the computation being in-place; that is, in-place refers to the amount of memory used above and beyond the program code. The program code may also make use of some fixed number of local program variables (indices of for loops, etc.) which are also not part of the memory used when referring to the computation as being in-place. We allow the encoder to use more memory if needed. The restriction that the decoder must operate in-place is desirable because it reflects practical applications where the decoder may have unknown or limited resources.

It is an object of this invention to perform in-place differential compression with methods that are both powerful (i.e., typically achieve high compression) and provide for fast and space efficient decoding.

MAX and MIN Notation

We use the notation MIN$\{x,y\}$ to denote the smaller of x and y and MAX$\{x,y\}$ to denote the larger of x and y.

Big O Notation

It is standard in the computer science literature to use Big O notation to specify how the amount of time or memory used by a method increases as a function of the input size. For two functions f and g, both of which map non-negative integers to non-negative integers, f(x) is said to be O(g(x)) if there exist two constants a and b such that for all integers $x \geq a$, $f(x) \leq b*g(x)$. For example, if a parameter K is chosen in such a way that K is O($\log_2$(MIN$\{m,n\}$)), then it must be true that there exists two constants a and b which are independent of m and n (a and b remain the same no matter what the values of m and n are) such that for all values of m and n for which MIN$\{m,n\} \geq a$, $K \leq b* \log_2$(MIN$\{m,n\}$).

The notation O(1) denotes a fixed constant. That is, f(x) is O(1) if there exists two constants a and b such that for all integers $x \geq a$, $f(x) \leq b$; if we let c be the constant equal to the maximum value of f(x) in the range $0 \leq x \leq b$, then $f(x) \leq c$ for all integers $x \geq 0$. A big O constraint can be combined with other constraints. For example, for a parameter K, saying that "K<MIN$\{m,n\}$ and K is O($\sqrt{\text{MIN}\{m,n\}}$)" means that although K may be chosen to be a function of m and n (i.e., K is larger when MIN$\{m,n\}$ is larger), for all m and n K<MIN$\{m,n\}$, and also, there exists two constants a and b such that $K \leq b* \sqrt{\text{MIN}\{m,n\}}$, for all m and n for which MIN$\{m,n\} \geq a$.

Memory

We use the term memory to refer to any type of computer storage, such as the computer's internal RAM memory, a hard drive, a read-writable disc, a communications buffer, etc. We use the term character to refer to the basic unit of data to which compression is being applied to a body of data in some computer memory. A common example of a character is a byte (8 bits) or a set of items that are stored one per byte (e.g. 7-bit ASCII codes). However, all of what we describe applies as well to other types of characters such as audio, image, and video data (e.g., for audio data that is stored using 12 bits per sample, the set of possible characters is the set of 4,096 distinct 12-bit values).

Although it is common for a body of data to be stored in sequential locations of memory, it is not required for this invention, it could be that different portions of the data are stored in different portions of memory. We assume that there is a linear ordering to a body of data (a first character, a second character, a third character, etc.). If a character x occurs earlier than a character y in the sequence of characters that comprise a body of data, then we say x is to the left of y, and y is to the right of x.

The size of a body of data is the number of characters that comprise it, and corresponds to the size of the memory used to store it (if the body of data resides in two or more disconnected portions of memory, the size of the body of data is the sum of the size of each of the portions of memory it occupies).

When we refer to the amount of memory used when decoding for in-place differential compression of a body of data T with respect to a body of data S, it is always understood that we are referring to the memory used to store portions of S and T, and that there may be an additional fixed amount of memory used to contain decoding instructions and local variables used for decoding (indices for loops, etc.).

Sliding Window Compression

Figure 2:
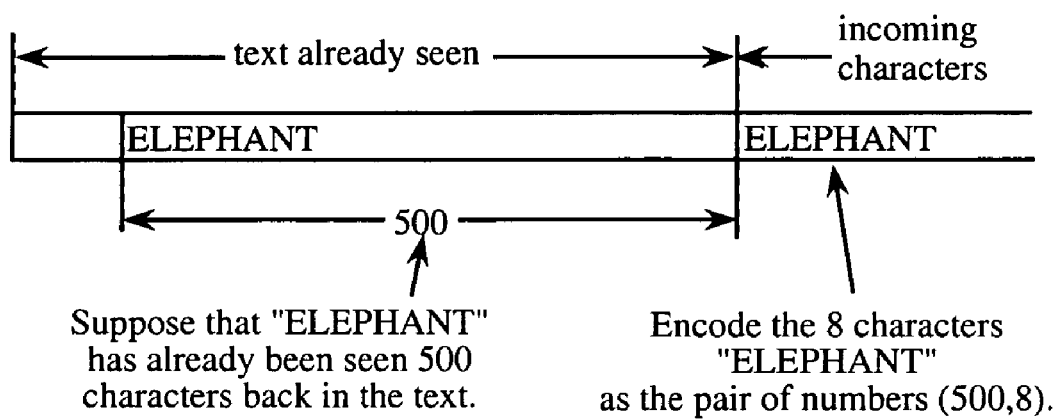
FIG. 2 shows the well known method of sliding window compression (prior art).

Referring to FIG. 2, to help describe our invention, we first review the well known method in the prior art of sliding window compression. The standard UNIX gzip utility is an example of a sliding window compressor/decompressor. Given a string, sliding window compression represents it with a smaller string by replacing substrings by a pointer consisting of a pair of integers (d,l) where d is a displacement back in a window of the last N characters and l is the length of an identical substring. The reduction in size achieved on a string depends on how often substrings are repeated in the text, how the pairs (d,l) are coded, etc. Typically "greedy" matching is used (always take the longest match possible).

There are many ways that have been proposed to encode pointers. A simple method based on fixed length codes is:

Displacements are represented with $\lceil \log_2(N) \rceil$ bits.

Lengths range from 3 to some upper limit MaxLength, which can be represented by the MaxLength-2 integers 0 through MaxLength-3, and use $\lceil \log_2(\text{MaxLength-2}) \rceil$ bits.

An initial flag bit distinguish a pointer (to a substring of 3 or more characters) from a code for a single character, where the leading bit is a 0 if the next $\lceil \log_2(A) \rceil$ bits to follow are a character and a 1 if the next $\lceil \log_2(N) \rceil + \lceil$ $\log_2(\text{MaxLength}-2)]$ bits to follow are a displacement and length, where A denotes the size of the input alphabet.

For example, if N=4,095, MaxLength=10, and we use the 128 character ASCII alphabet (A=128), a single character is represented with one byte (a flag bit and 7 ASCII bits) and a pointer uses two bytes (a flag bit, 12 displacement bits, and 3 length bits).

Other methods may use variable length codes (some of which may be able to represent a string of two bytes with less than 16 bits).

It is also possible to employ an off-the-shelf variable length coder to encode fields of a pointer. For example, to compress data where very large matches may be present, one could use the following coding method for pointers that employs an arithmetic coder:

The pointer format begins with a control integer between 0 and 4 that indicates one of the following cases:
Case 0: No displacement or length; the bits to follow indicate a single raw character.
Case 1: Displacements <4,096 that point to a match of length <256.
Case 2: Displacements between 4 KB and 36 KB that point to a match of length <256.
Case 3: Displacements larger than 36 KB that point to a match of length <256.
Case 4: Displacements larger than 36 KB that point to a match of length >256.
Separate off-the-shelf arithmetic encoders are used to encode control integers, the raw character for Case 0, and the length fields for Cases 1 through 3.
A fixed code of either 12 or 15 bits is used for the displacements for Cases 1 and 2. A fixed length $\lceil \log_2(N) \rceil$ code is used for the displacement fields of Cases 3 and 4 and for the and length field of Case 4.

The Present Invention

A problem with previous methods for differential compression is their use of more computational resources (e.g., time and memory) than may be necessary and/or the need to sacrifice achievable compression in order to achieve acceptable resources. Here we propose a high performance fast method for performing differential compression in place.

The solution proposed here uses the In-Place Sliding Window (IPSW) method to compress a body of data T of size n with respect to a body of data S of size m:

IPSW Encoding Algorithm:
Step 1: Append T to the end of S.
Step 2: Compress T with a sliding window of size MAX{m,n}.

When the encoder slides a window of size MAX{m,n}, if m is equal to or larger than n, then only at the start can pointers reach all the way back to the start of S, and as we move to the right, more of S becomes inaccessible. If m is less than n, then after producing the first n−m characters of T, it again becomes the case that pointers cannot reach all the way back to the start of S. In either case, by overwriting the no longer accessible portion of S from left to right, decoding can be done in-place, using MAX{m,n} memory (encoding may use m+n memory). That is, each time an additional pointer is received by the decoder, it is decoded and the window slides right to add characters to the right of T and remove them from the left of S. If m<n, then decoding increases the size m of the memory to store S to a size n of memory to store T. If m>n, then after decoding is complete, T resides in what used to be the rightmost n characters of S, and the memory for what used to be the first m−n characters of S can be reclaimed.

Of course, the decoding may use a fixed amount of memory for the decoding instructions (which could be read-only memory or hardware) and a fixed amount of memory to contain a fixed number of local variables used for decoding (indices of loops, etc.). This fixed amount of memory is independent of m and n. Using big O notation, the memory used for decoding instructions is O(1) and the number of local variables is O(1). When we say that decoding can be done in-place using MAX{m,n} memory, it is always understood that the memory used for decoding instructions and local variables is in addition to this MAX{m,n} memory.

Referring to FIG. 1, depicted is encoding (top) and decoding (bottom) for when the size of T is 50 percent larger than the size of S, and we are at the point when n−m+x characters of T have been encoded. The hatched region is all of S on the top and the remaining portion of S on the bottom. The lightly shaded region is the n−m characters of T that have already been encoded and decoded by the decoder without having to overwrite S. The dark shaded region is the portion of T that has already been encoded by overwriting the first x characters of S. The remaining m−x characters of T have yet to be encoded, and hence the rightmost m−x characters of S are still available to the decoder. The decoder's window can be viewed as two pieces: the already decompressed portion of T (the lightly shaded and darkly shaded regions) that is to the left of the pointer and the remaining portion of S that is to the right of the pointer (but was to the left of the lightly shaded and darkly shaded regions when encoding). So for each pointer decoded, at most two string copies must be performed: a single copy when the match is contained entirely in S (hatched region) or entirely in T (lightly shaded and darkly shaded regions) or two copies when the match starts in S and ends in T (the encoder encodes a match that crosses the boundary between the hatched region and the lightly shaded region). Since in many practical applications matches that cross this boundary are really just "lucky" (i.e., we may be primarily looking for large matches to S and if they are not found then a match in T that is a shorter distance away), an alternate embodiment of this invention is to forbid copies that cross this boundary, in order to further simplify decoding.

Any reasonable implementation of sliding window encoding can be used that allows for large matches. For example, the UNIX gzip utility that uses a window of size 32K and maximum match length 256; it is easy to modify the UNIX gzip utility to use a simple escape code for long pointers (e.g. reserve the longest possible length or displacement for the escape code) so that the same algorithm can be used for normal matches and the increased pointer length is only associated with large matches.

Another object of this invention is, when in some applications it may be that there is some additional amount of memory K available, to take advantage of this additional memory to improve the amount of compression achieved. It could be that K is a relatively small amount of memory that grows larger as m and n grow larger, such as K being $O(\sqrt{\text{MIN}\{m,n\}})$ or even K being $O(\log_2(\text{MIN}\{m,n\}))$, or it could be that K is relatively large, but still not large enough to retain a separate copy of S while decoding (that is, K<MIN{m,n}), such as 50 percent of the additional memory needed (that is, K=MIN{m,n}/2) or even 90% of the additional memory needed (that is, K=(9/10)MIN{m,n}). An additional amount of memory K can be utilized to potentially improve compression by lengthening the sliding window to size MAX{m,n}+K, thus delaying by an additional K characters the point at which S begins to be overwritten when decoding. That is, encoding begins with S as the rightmost characters of a window of size MAX(m,n)+K.

In many practical applications, such as distribution of successive versions of a software application, S and T are highly similar and reasonably well aligned; that is, large matches between S and T occur in approximately the same relative order. In this case, IPSW can be a fast method that performs in-place as well as methods that are not in-place.

Another object of this invention is to achieve good performance even when S and Tare not well aligned, by preceding IPSW with an additional step to improve alignment. Poor alignment could happen, for example, with a software update where for some reason the compiler moved large blocks of code around. An extreme case is when the first and second halves of S have been exchanged to form T (S=uv and T=vu); to decompress T the IPSW algorithm overwrites u as it copies v, and then the ability to represent v with a single copy is lost. Rather than modify IPSW (which is already a very fast and practical method that suffices for many and perhaps most practical inputs), we propose a preprocessing stage for IPSW that moves substrings within S to better align S with T. The compressed format can incorporate a way for the decoder to determine whether preprocessing was performed (e.g., compressed data can be begin with an initial bit indicating whether preprocessing has occurred). The encoder can compress T with IPSW and compare that to compressing T with respect to S not in place (so at all times all substrings of S are available to be copied). If the difference is significant, this initial bit can be set, alignment preprocessing performed, and a list of moves prepended the normal IPSW encoding. The decoder can perform the moves and then proceed in-place with normal IPSW decoding.

If the encoder determines that S and Tare not well aligned, then the goal of preprocessing for the IPSW algorithm is to find a minimal set of substring moves to convert S to a new string S' that is well aligned with T. We limit our attention to moves that are non-overlapping, where the moves define a parsing of S and T into matched blocks, $\{b_i\}_{i=1...r}$ and junk blocks, $\{x_i,y_i\}_{i=1...r}$; that is, $S=x_0 \cdot b_{\sigma(1)} \cdot x_1 \cdot b_{\sigma(2)} \cdot x_2 \ldots x_{r-1} \cdot b_{\sigma(r)} \cdot x_r$ and $T=y_0 \cdot b_1 \cdot y_1 \cdot b_2 \cdot y_2 \ldots y_{r-1} \cdot b_r \cdot y_r$. When using the sliding window method, we would like to copy substrings of S only from the part that was not yet overwritten by the reconstruction of T. That is, we would like to perform only left copies, i.e., a copy $(s_i, d_i, l_i)$ that copies a substring with $l_i$ characters from position $s_i$ to position $d_i$ that satisfies $s_i \geq d_i$.

We can improve upon the idea of greedy block-move edit distance computation proposed in Shapira and Storer [2002] by using two different kinds of rearrangements of the blocks. Moves rearrange the blocks $\{b_i\}_{i=1...r}$ so that they occur in S and T at the same order. Jigglings move the junk blocks of S backwards, so that, as a side affect, the matched blocks are moved forwards.

Move Preprocessing Algorithm:
Step 1: Find Non Overlapping Common Substrings (NOCS) of S and T from longest to shortest down to a minimum length stoplength. These are the $\{b_i\}_{i=1...r}$ blocks.
Step 2: Compute the minimum number of rearrangements (moves and jigglings) in S so that the blocks $\{b_i\}_{i=1...r}$ are left copies within S and T.
Step 3: Generate S' according to step 2.
Step 4: Compute IPSW(S',T).

Step 1 can be performed by repeatedly applying a longest common substring computation (see, for example, the text book *An Introduction to Data Structures and Algorithms*, by J. A. Storer, Birkhauser/Springer, 2002), or by using the linear time method of M. Meyerovich, D. Shapira, and J. A. Storer ("Finding Non-Overlapping Common Substrings in Linear Time", Technical Report CS-03-236, Comp. Science Dept., Brandeis University); minlength can be tuned for different applications, where a value of 256 has been found to be a good general practical choice. Since the encoder is not restricted to work in-place, generating S' in Step 3 can be done in linear time by copying the strings to a different location. Step 4 uses the fast linear time IPSW algorithm that has already been described as one of the objects of this invention.

We now describe how Step 2 can be done in quadratic time of the number of blocks, which is in the worst case $O((n/\text{stoplength})^2)$; in practice, the number of blocks is much smaller than $\sqrt{n}$, and Step 2 works in linear time. The NOCS found in Step 1 are renamed using different characters, and then the method of Shapira and Sorer [2002] can be performed to compute minimum edit distance with moves to attain the moved characters for the minimum cost which correspond to moving the NOCS. Our next goal is to produce a (source, destination) format for the NOCS moves to be sent to the decoder based on the character moves. For example, when dealing with 5 NOCS renamed by {1, 2, 3, 4, 5} one possibility to obtain 12345 from 15432 by character moves is by moving 2, 3, and 4, where 4 is moved backwards. Another option for transforming 15432 to 12345 is by moving 3, 4 and 5, where 4 is moved forwards. Each one of these solutions can be obtained from the dynamic-programming table from different optimal paths going from cell [r,r] (for integers 1 through r) back to cell [0,0], from which their alignment can be extracted. The source and destination positions depend on the order the moves are performed. Therefore, the encoder performs and reports one character move at a time, updating the source and destination locations, before proceeding with the next move. We define each item's destination to be the corresponding positions just after the last aligned item to its left. If there is no such item, the item is moved to the beginning of the array. The move causes a shift of all items to its right, and the item is marked as an aligned item after the move is performed. Let $\{b_i\}_{i=1...r}$ be a set of r matched blocks to be moved from source positions $s_i$ to destination position $d_i$, and let $\{x_j\}_{j=i...r}$ be the 'junk' blocks we wish to jiggle to the beginning of S, so that all blocks $\{b_i\}_{i=1...r}$ perform only left copies, i.e., $S_i \geq d_i$. After performing the block moves in S to obtain S', we have $S'=x_0 b_1 \cdot x_1 \cdot b_2 \cdot x_2 \ldots x_{r-1} \cdot b_r \cdot x_r$, and $T=y_0 b_1 \cdot y_1 \cdot b_2 \cdot y_2 \ldots y_{r-1} \cdot b_r \cdot y_r$. To see that it is always possible to perform jigglings so that the matched blocks become left copies consider the worst situation, where all blocks $\{b_i\}_{i=1...r}$ are shifted all the way to the right, without ruining their order obtained from the edit-distance algorithm. Since the space available is at least n, we are left with only left copies. Thus, in the worst situation we perform r−1 moves and r jigglings. We are interested in minimizing this number. Each block that was moved already in the edit-distance with move algorithm, is farther moved to the right, so that it is now adjacent to its right non-junk neighbor. These moves are done for free, since they can be moved to the final point directly. At each stage of the jiggling algorithm, when we reach an illegal copy (i.e., a right copy), we choose the longest junk block to its right, and move it to the left of the leftmost illegal copy, which results in shifting all other blocks to the right.

A further object of this invention is for the decoder to perform the move pre-processing in-place. Let S be a string of length m, and x, y denote the source and destination locations of a substring s of S of length l to be moved. Since the problem is symmetric for left versus right moves, and since we can easily incorporate an offset, assume x=0, y>0, and y specifies the character that follows s after the move (e.g., if S=abcdefgxyz, l=3, and y=7, then abc is moved so that S=defgabcxyz). A naive algorithm, that uses O(1) additional memory and $O(y^2)$ time, moves the characters of s individually, shifting the entire string between the source and destination locations at each step.

For a more efficient algorithm, observe that each character of s goes a distance d=y−l, and the move is tantamount to rearranging positions 0 through y−1 by the permutation i→(i+d) MOD y. A standard in-place permutation algorithm (e.g., see the book of Storer [2002]) starts with positions 0 through y−1 "unmarked" and then for each position, if it is unmarked, follows its cycle in the permutation and marks each position visited, for a total of O(y) time and y additional bits of memory for the mark bits. Here, mark bits for only MIN{l,d} positions are needed, since every cycle passes through at least one of the positions 0 through l−1 and at least one of the positions l through y−1. If l or d is O(log(m)), then we use O(1) memory under our model, since we are assuming at least enough memory to store O(1) local variables, which are each capable of holding O(log(m)) bits (e.g., for m<4 billion, 32 bits suffice to store an index variable in a loop that counts from 1 to m). If an additional amount of memory K is available that suffices to store these bits, then we can employ this additional memory for this purpose. Otherwise, in $O(y^{1/2} \log(y))$ time we can test y, y−1, y−2, ... until we find the largest prime p≦y; that is, $d^{1/2}$ operations suffice to test, and approximately ln(y) positions are tested, where ln denotes the natural logarithm (this follows from the classic the "Prime Number Theorem" which appears in many basic texts on number theory). Then, let d'=p−l, and using no mark bits, move s most of the way by the permutation i→(i+d') MOD p (since p prime implies that the permutation is a single cycle that we can traverse until we return to the start). Finally, after adjusting the offset so that s starts at position 0, move s to position y'=l+(y−p) with the permutation i→(i+(y−p)) MOD y'; since (y−p)≈ln (y)=O(log(m)), again, this can be can be done with O(1) additional memory in our model (i.e., we are assuming at least enough memory to store O(1) local variables, which are each capable of holding O(log(m)) bits).

Another object of our invention is to provide the possibility of using an existing "off-the-shelf" compression method after a set of strongly aligned moves has been performed on S. We say that a set of substring moves performed on S to create a string S2 is strongly aligned if when we write S2 below S and draw a straight line from each character in S that is moved to where it is in S2, then no lines cross.

We can perform all strongly aligned moves for a string of length m in a total of O(m) time and O(1) additional memory, using only simple string copies (that may overwrite characters that are no longer needed). We scan twice, first from left to right to copy blocks that go to the left and then from right to left to copy blocks that go to the right. Let $x_i$, $y_i$ and $l_i$, 1≦i≦n, denote the source and destination locations and the lengths of k aligned move operations for a string stored in the array A:

for i:=1 to n do if i is a source position such that $x_i > y_i$ then
   for j:=1 to $l_i$ do $A[y_i+j]:=A[x_i+j]$
for i:=n downto 1 do if i is a source position such that $x_i < y_i$ then
   for j:=$l_i$ downto 1 do $A[y_i+j]:=A[x_i+j]$ Any reasonable encoder (which need not work in-place) to construct a sequence of aligned moves may suffice in practice for applications where large aligned moves exist. For example, a greedy approach can parse the text twice, using two thresholds: $C_1$ and $C_2$, where $C_1$ is much larger than $C_2$. First extract matches longer than $C_1$, and then search between two subsequent aligned matches for matches longer than $C_2$.

Figure 3:
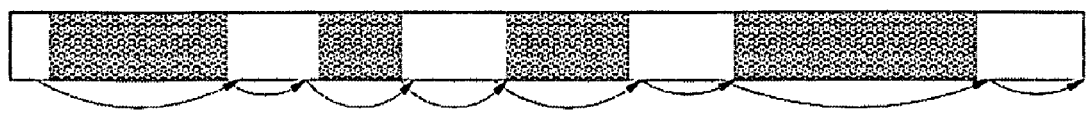
FIG. 3 shows the of linking gaps when off-the-shelf compression follows aligned moves.

Assuming that a move operation is represented by three components (source position, destination position, and length), after the preprocessing step is complete, and the decoder has performed all of the move operations, the gaps can now be filled in by running a standard decompressor on the remaining bits so long as we are careful during preprocessing to remember these positions. This can be done by linking them together as depicted in FIG. 3; the encoder can be implemented to insure that each gap is large enough to hold a pointer (e.g., 4 bytes to handle moves of 4 billion characters). From the point of view of the off-the-shelf decoder, a contiguous string is produced, which we just happen to partition to fill the gaps.

Another way to use the off-the-shelf compressor is to modify it slightly so that gaps are compressed in their local context. For example, with a sliding window method, the window could be defined to go contiguously back to the left end of the current gap and then continue on back into the previous block.

A third way to use the off-the-shelf compressor is to use a single pointer value as an escape (followed by a displacement and length) to a match into the decoded string rather than into some additional memory used by the off-the-shelf encoder/decoder that is in addition to the MAX{m,n} memory normally allocated for in-place decoding; for example, this would be another way to make use of an additional amount K of memory.

Although this invention has been primarily described as a method, a person of ordinary skill in the art can understand that an apparatus, such as a computer, could be designed or programmed to implement the method of this invention. Similarly, a person of ordinary skill in the art can understand that there are many types of memory that can be used to implement memory for the purpose of this invention (RAM memory, hard drive, read-write disk, data buffers, hardware gates, etc.).

Since certain changes may be made in the above methods and apparatus without departing from the scope of the invention herein involved, it is intended that all matter contained in the above description or shown in the accompanying drawings shall be interpreted in an illustrative and not in a limiting sense.

The invention claimed is:

1. A method for differential compression of a body of data S with respect to a body of data T, comprising the steps of:
   initializing a sliding window W of size MAX{m,n}+K so that its rightmost m characters are S,
   where K is an integer such that 0≦K<MIN{m,n};
   performing sliding window compression of T with window W,
   to produce a sequence of pointers,
   where each of said pointers represents a single character or represents a copy of an earlier substring of T or represents a copy of a substring of S, such that at least one of said pointers represents a copy of a substring of S;
transmitting each pointer of said sequence of pointers to a utilization device that contains a copy of S;
upon receiving each of said pointers at said utilization device,
performing an additional sliding window decoding step in the recovery of T,
in such a way that the size of the memory used is no more than MAX{m,n}+K,
and such that after the last pointer is received T is fully recovered.

2. A method according to claim 1, further comprising the step of:
Rearranging substrings of S to that S is better aligned with T.

3. A method according to claim 1 where K≦MIN{m,n}/2.

4. A method according to claim 1 where K is O($\sqrt{\text{MIN}}${m,n}).

5. A method according to claim 1 where K=0.

6. A method for representing a first body of data T of size n by a second body of data S of size m and a sequence of pointers,
where each of said pointers represents a single character or represents a copy of an earlier substring of T or represents a copy of a substring of S,
such that at least one of said pointers represents a copy of a substring of S,
so that it is possible to recover T from S by processing said sequence of pointers and overwriting S from left to right,
in such a way that the size of the memory used is no more than MAX{m,n}+K,
where K is an integer such that 0≦K<MIN{m,n}.

7. A method according to claim 6, further comprising the step of:
Rearranging substrings of S to that S is better aligned with T.

8. A method according to claim 6 where K≦MIN{m,n}/2.

9. A method according to claim 6 where K is O($\sqrt{\text{MIN}}${m,n}).

10. A method according to claim 6 where K=0.

11. A method of recovering a first body of data T of size n from a second body of data S of
size m and a sequence of pointers, where each of said pointers represents a single character or represents a copy of an earlier substring of T or represents a copy of a substring of S,
such that at least one of said pointers represents a copy of a substring of S,
by processing said sequence of pointers and overwriting S from left to right,
in such a way that the size of the memory used is no more than MAX{m,n}+K,
where K is an integer such that 0≦K<MIN{m,n}.

12. A method according to claim 11, further comprising the step of:
Rearranging substrings of S to that S is better aligned with T.

13. A method according to claim 11 where K<MIN{m,n}/2.

14. A method according to claim 11 where K is O($\sqrt{\text{MIN}}${m,n}).

15. A method according to claim 11 where K=0.

16. A system for differential compression of a body of data S with respect to a body of data T, comprising:
means for initializing a sliding window W of size MAX{m,n}+K so that its rightmost m characters are S, where K is an integer such that 0≦K<MIN{m,n};
means for performing sliding window compression of T with window W,
to produce a sequence of pointers,
where each of said pointers represents a single character or represents a copy of an earlier substring of T or represents a copy of a substring of S,
such that at least one of said pointers represents a copy of a substring of S;
means for transmitting each pointer of said sequence of pointers to a utilization device that contains a copy of S;
means for upon receiving each of said pointers at said utilization device,
performing an additional sliding window decoding step in the recovery of T,
in such a way that the size of the memory used is no more than MAX{m,n}+K,
and such that after the last pointer is received T is fully recovered.

17. A system as in claim 16, further comprising:
Rearranging substrings of S to that S is better aligned with T.

18. A system according to claim 16 where K<MIN{m,n}/2.

19. A system according to claim 16 where K is O($\sqrt{\text{MIN}}${m,n}).

20. A system according to claim 16 where K=0.

21. A system for recovering a first body of data T of size n from a second body of data S of size m and a sequence of pointers,
where each of said pointers represents a single character or represents a copy of an earlier substring of T or represents a copy of a substring of S,
such that at least one of said pointers represents a copy of a substring of S, with means for:
processing said sequence of pointers and overwriting S from left to right,
in such a way that the size of the memory used is no more than MAX{m,n}+K.

22. A system as in claim 21, further comprising:
Rearranging substrings of S to that S is better aligned with T.

23. A system for differential compression and decompression of a body of data T with respect to a body of data S comprising means for:
computing strongly aligned moves and using off-the-shelf compression and decompression to represent the portions of T not represented by substring moves within S, in such a way that the size of the memory used when decoding is no more than MAX{m,n}+K, where K is an integer such that 0≦K<MIN{m,n}.

* * * * *